United States Patent
Shinohara

(10) Patent No.: US 9,816,012 B2
(45) Date of Patent: Nov. 14, 2017

(54) METHOD FOR MANUFACTURING ELECTRICALLY CONDUCTIVE ADHESIVE FILM, ELECTRICALLY CONDUCTIVE ADHESIVE FILM, AND METHOD FOR MANUFACTURING CONNECTOR

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/904,456

(22) PCT Filed: Jul. 28, 2014

(86) PCT No.: PCT/JP2014/069793
§ 371 (c)(1),
(2) Date: Jan. 12, 2016

(87) PCT Pub. No.: WO2015/016167
PCT Pub. Date: Feb. 5, 2015

(65) Prior Publication Data
US 2016/0168428 A1    Jun. 16, 2016

(30) Foreign Application Priority Data
Jul. 29, 2013   (JP) .................................. 2013-157098

(51) Int. Cl.
*B32B 3/00*        (2006.01)
*C09J 9/02*        (2006.01)
(Continued)

(52) U.S. Cl.
CPC .  *C09J 9/02* (2013.01); *C09J 7/00* (2013.01); *C09J 11/04* (2013.01); *H01R 4/04* (2013.01);
(Continued)

(58) Field of Classification Search
CPC .. H05K 3/321; H05K 3/323; H05K 2201/035; H05K 2203/0139;
(Continued)

(56) References Cited

U.S. PATENT DOCUMENTS

| | | | | |
|---|---|---|---|---|
| 5,616,206 A | * | 4/1997 | Sakatsu | ............... H01L 21/4853 156/230 |
| 6,063,701 A | * | 5/2000 | Kuwazaki | ........... H01L 21/4853 228/180.22 |
| 2006/0280912 A1 | * | 12/2006 | Liang | ...................... H01B 1/22 428/173 |

FOREIGN PATENT DOCUMENTS

| | | |
|---|---|---|
| JP | H11-260164 A | 9/1999 |
| JP | 2010-033793 A | 2/2010 |

(Continued)

Primary Examiner — Elizabeth Mulvaney
(74) Attorney, Agent, or Firm — Oliff PLC

(57) ABSTRACT

A step of scattering electrically conductive particles on a wiring board having wiring that is formed in accordance with an array pattern of the electrically conductive particles and prevented from being charged, and charging the electrically conductive particles; a step of aligning the charged electrically conductive particles in a predetermined array pattern corresponding to the wiring pattern by moving a squeegee on the wiring board; and a step of bonding a transfer film having an adhesive material layer formed thereon to the wiring board and transferring the electrically conductive particles aligned in a predetermined array pattern to the adhesive layer.

13 Claims, 12 Drawing Sheets

(51) Int. Cl.
*C09J 7/00* (2006.01)
*C09J 11/04* (2006.01)
*H01R 4/04* (2006.01)
*H01R 43/00* (2006.01)
*H05K 3/32* (2006.01)
*H05K 3/30* (2006.01)
*C08K 3/04* (2006.01)
*C08K 3/08* (2006.01)
*H01R 12/62* (2011.01)

(52) U.S. Cl.
CPC ........... *H01R 43/007* (2013.01); *H05K 3/303* (2013.01); *H05K 3/323* (2013.01); *C08K 3/04* (2013.01); *C08K 3/08* (2013.01); *C08K 2201/001* (2013.01); *C09J 2201/602* (2013.01); *C09J 2203/326* (2013.01); *C09J 2205/102* (2013.01); *H01R 12/62* (2013.01); *H05K 2201/0224* (2013.01); *H05K 2203/0139* (2013.01); *H05K 2203/0278* (2013.01)

(58) Field of Classification Search
CPC ..... H05K 2203/0338; C09J 9/02; C09J 11/04; C09J 7/00
See application file for complete search history.

(56) References Cited

FOREIGN PATENT DOCUMENTS

| JP | 2010-251337 A | 11/2010 |
| JP | 4789738 B2 | 10/2011 |

\* cited by examiner

METHOD FOR MANUFACTURING ELECTRICALLY CONDUCTIVE ADHESIVE FILM, ELECTRICALLY CONDUCTIVE ADHESIVE FILM, AND METHOD FOR MANUFACTURING CONNECTOR

TECHNICAL FIELD

The present invention relates to an electrically conductive adhesive, particularly relates to a method for manufacturing an electrically conductive adhesive film that is suitably usable in anisotropic conductive connection, an electrically conductive adhesive film manufactured by using this manufacturing method, and a method for manufacturing a connector using this electrically conductive adhesive film.

This application is based upon and claims the benefit of priority of the prior Japanese Patent Application No. 2013-157098 filed in the Japan Patent Office on Jul. 29, 2013, the entire contents of which are incorporated herein by reference.

BACKGROUND ART

Hitherto, an anisotropic conductive film obtained by molding a binder resin in which electrically conductive particles are dispersed as an adhesive into a film is used when connecting a rigid substrate such as a glass substrate or a glass epoxy substrate to a flexible substrate or an IC chip or when connecting flexible substrates to each other. When the case of connecting the connecting terminal of a flexible substrate to the connecting terminal of a rigid substrate is described as an example, as illustrated in FIG. 12(A), an anisotropic conductive film 53 is disposed between the regions in which both connecting terminals 52 and 55 of a flexible substrate 51 and a rigid substrate 54 are formed, a buffer material 50 is appropriately disposed on the flexible substrate 51, and the substrates 51 and 54 are heat-pressurized from the top of the flexible substrate 51 by a heating and pressing head 56. By virtue of this, as illustrated in FIG. 12(B), the binder resin becomes fluid to flow out from between the connecting terminal 52 of the flexible substrate 51 and the connecting terminal 55 of the rigid substrate 54 and also the electrically conductive particles in the anisotropic conductive film 53 are pressed and deformed by being sandwiched between the two connecting terminals.

As a result, the connecting terminal 52 of the flexible substrate 51 and the connecting terminal 55 of the rigid substrate 54 are electrically connected to each other via the electrically conductive particles, and the binder resin is cured in this state. The electrically conductive particles that are not present between the two connecting terminals 52 and 55 are dispersed in the binder resin and maintained in the electrically isolated state. By virtue of this, it is possible to achieve electrical conduction only between the connecting terminal 52 of the flexible substrate 51 and the connecting terminal 55 of the rigid substrate 54.

CITATION LIST

Patent Literatures

Patent Literature 1: JP 04-251337 A
Patent Literature 2: JP 2010-251337 A
Patent Literature 3: JP 4789738 B1

SUMMARY OF INVENTION

Technical Problem

In recent years, high density mounting of electronic components has advanced in association with the miniaturization and thinning mainly of small-sized portable electronic devices such as a mobile phone or a smart phone, a tablet PC, and a notebook computer, and the microminiaturization of the connecting terminals and the narrowing of the interval between the adjacent connecting terminals have advanced in a so-called FOB (Film on Board) connection to connect a flexible substrate to a main substrate or a so-called FOF (Film on Film) connection to connect flexible substrates to each other. In addition, the microminiaturization of the connecting terminals due to an increase in terminals associated with high definition of the screen and miniaturization of the control IC and the narrowing of the interval between the adjacent connecting terminals have advanced in a so-called COG (Chip on Glass) connection to connect the control IC of a liquid crystal screen to the ITO wiring of a glass substrate.

As such microminiaturization of the connecting terminals associated with the requirement of high density mounting and the narrowing of the interval between connecting terminals advance, it is concerned that the electrically conductive particles are linked to one another between the micro terminals to cause a short circuit between the terminals since the electrically conductive particles are randomly dispersed in the binder resin in the anisotropic conductive film of prior art.

In order to cope with such a problem, a decrease in particle size of the electrically conductive particles and a method to form an insulating film on the particle surface have been proposed, but it is concerned that the particle capture rate on the microminiaturized connecting terminal decreases when the particle size of the electrically conductive particles decreases, and it is not possible to completely prevent the short circuit between the terminals in the case of forming the insulating film. Furthermore, a method to separate the electrically conductive particles from one another through biaxial stretching has also been proposed, but not all of the electrically conductive particles are separated, the aggregate of particles in which a plurality of electrically conductive particles are linked to one another remains, and thus it is not possible to completely prevent a short circuit between the terminals generated between the adjacent terminals.

Accordingly, an object of the invention is to provide a method for manufacturing an electrically conductive adhesive film which can capture electrically conductive particles in a microminiaturized connecting terminal as well as prevent a short circuit between terminals even though microminiaturization of the connecting terminal and the narrowing of the interval between connecting terminals advance and thus can meet the requirement of high density mounting, an electrically conductive adhesive film, and a method for manufacturing a connector.

Solution to Problem

In order to solve the above problem, a method for manufacturing an electrically conductive adhesive film according to the invention is a method which includes a step of scattering electrically conductive particles on a wiring board having wiring that is formed in accordance with an array pattern of the electrically conductive particles and prevented from being charged and charging the electrically conductive particles, a step of aligning the charged electrically conductive particles in a predetermined array pattern corresponding to the wiring pattern by moving a squeegee on the wiring board, and a step of bonding a transfer film having an adhesive layer formed thereon to the wiring board and transferring the electrically conductive particles aligned in a predetermined array pattern to the adhesive layer.

In addition, an electrically conductive adhesive film according to the invention is one that is manufactured by the manufacturing method described above.

In addition, a method for manufacturing a connector according to the invention is a method for manufacturing a connector obtained by connecting a plurality of terminals arranged in parallel to one another by an anisotropic conductive film having electrically conductive particles arranged therein, in which the anisotropic conductive film is manufactured by a step of scattering electrically conductive particles on a wiring board having wiring that is formed in accordance with an array pattern of the electrically conductive particles and prevented from being charged and charging the electrically conductive particles, a step of aligning the charged electrically conductive particles in a predetermined array pattern corresponding to the wiring pattern by moving a squeegee on the wiring board, and a step of bonding a transfer film having an adhesive layer formed thereon to the wiring board and transferring the electrically conductive particles aligned in a predetermined array pattern to the adhesive layer, and the anisotropic conductive film is sandwiched between the terminals by taking a parallel direction of the terminals as a longitudinal direction.

Advantageous Effects of Invention

According to the invention, the electrically conductive adhesive film is formed by transferring the electrically conductive particles after being aligned in a predetermined array pattern to the adhesive layer. Hence, it is possible to equally disperse and dispose the electrically conductive particles on the adhesive layer since the electrically conductive particles are aligned in a desired array pattern in advance, and this makes it possible to provide an electrically conductive adhesive film which can capture the electrically conductive particles in the microminiaturized connecting terminal as well as prevent a short circuit between terminals even though microminiaturization of the connecting terminal and the narrowing of the interval between connecting terminals advance and thus can meet the requirement of high density mounting.

BRIEF DESCRIPTION OF DRAWINGS

FIGS. 11(A) to 11(C) are views illustrating a roll-shaped substrate, in which FIGS. 11(A) and 11(B) are perspective views, and FIG. 11(C) is a cross-sectional view illustrating a manufacturing process using a roll-shaped substrate.

FIGS. 12(A) and 12(B) are cross-sectional views illustrating the manufacturing process of a connector using an anisotropic conductive film of prior art, in which FIG. 12(A) illustrates the state before pressure joining, and FIG. 12(B) illustrates the state after pressure joining.

DESCRIPTION OF EMBODIMENTS

Hereinafter, the method for manufacturing an electrically conductive adhesive film, an electrically conductive adhesive film, and a method for manufacturing a connector to which the invention is applied will be described in detail with reference to the accompanying drawings. Incidentally, the invention is not intended to be limited only to the following embodiments, but it should be understood that the various changes, substitutions, and alterations could be made hereto without departing from the spirit and scope of the invention. In addition, the drawings are schematic, and the ratio and the like of the respective dimensions may be different from the reality. The specific dimensions and the like should be judged in consideration of the following description. Moreover, it should be understood that the drawings include portions in which the relationships and ratios of the dimensions are different from one another.

[Anisotropic Conductive Film]

The electrically conductive adhesive film to which the invention is applied is suitably used as an anisotropic conductive film 1 for achieving conduction between connecting terminals as electrically conductive particles are equally dispersed and disposed on a binder resin to be an adhesive in a predetermined pattern and the electrically conductive particles are sandwiched between the connecting terminals facing each other. In addition, as the connector using an electrically conductive adhesive film to which the invention is applied is, for example, a connector in which an IC or a flexible substrate is COG, FOB, or FOF connected using the anisotropic conductive film 1 and another connector, and the connector can be suitably used in any devices such as television, or PC, mobile phones, game machines, audio devices, and tablet terminators, or vehicle-mounted monitors.

The anisotropic conductive film 1 is a thermosetting adhesive or a photocurable adhesive such as an ultraviolet curable adhesive, is fluidized by being heated and pressurized by a pressure tool (not illustrated) so that the electrically conductive particles are pressed and deformed between the connecting terminals facing to each other, and is cured by being heated or irradiated with ultraviolet rays in a state in which the electrically conductive particles are pressed and deformed. By virtue of this, the anisotropic conductive film 1 electrically and mechanically connects an IC or a flexible substrate to a connecting target such as a glass substrate.

Figure 1:
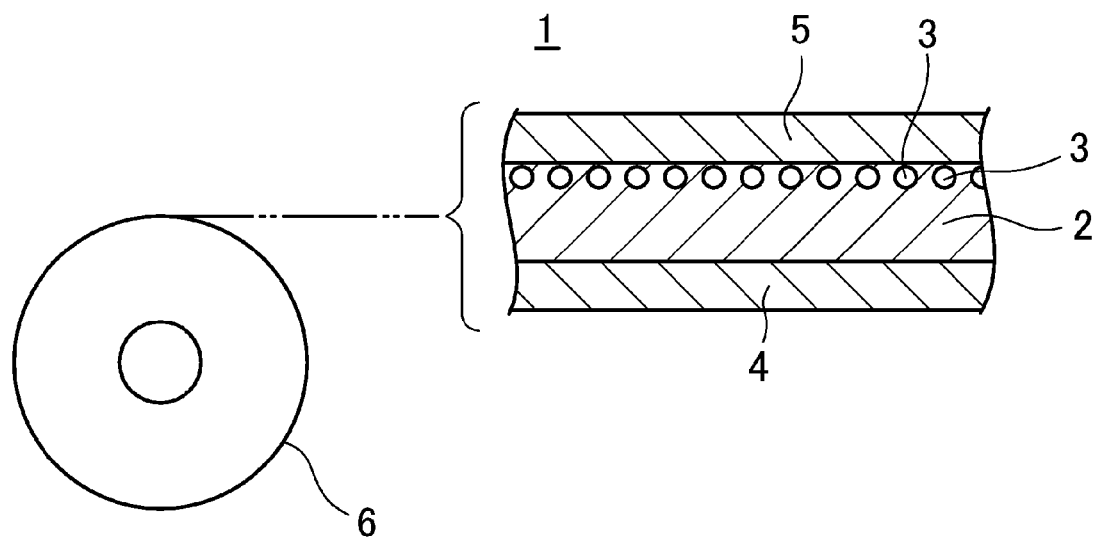
FIG. 1 is a cross-sectional view illustrating an anisotropic conductive film to which the invention is applied.

The anisotropic conductive film 1 is one, for example, as illustrated in FIG. 1, in which electrically conductive particles 3 are disposed on an ordinary binder resin 2 (adhesive)

containing a film-forming resin, a thermosetting resin, a latent curing agent, a silane coupling agent, and the like in a predetermined pattern and this thermosetting adhesive composition is supported by first and second base films 4 and 5 of an upper and lower pair.

The first and second base films 4 and 5 are formed, for example, by coating a release agent such as silicone on PET (Poly Ethylene Terephthalate), OPP (Oriented Polypropylene), PMP (Poly-4-methylpentene-1), PTFE (Polytetrafluoroethylene), and the like.

As the film forming resin contained in the binder resin 2, a resin having an average molecular weight of about from 10000 to 80000 is preferable. Examples of the film forming resin may include various kinds of resins such as an epoxy resin, a modified epoxy resin, a urethane resin, and a phenoxy resin. Among them, a phenoxy resin is even more preferable from the viewpoint of the film formed state, connection reliability, and the like.

The thermosetting resin is not particularly limited, and examples thereof may include an epoxy resin and an acrylic resin that are commercially available.

The epoxy resin is not particularly limited, and examples thereof may include a naphthalene type epoxy resin, a biphenyl type epoxy resin, a phenol novolak type epoxy resin, a bisphenol type epoxy resin, a stilbene type epoxy resin, a triphenol methane type epoxy resin, a phenol aralkyl type epoxy resin, a naphthol type epoxy resin, a dicyclopentadiene type epoxy resin, and a triphenylmethane type epoxy resin. These may be a single substance or a combination of two or more kinds thereof.

The acrylic resin is not particularly limited, and an acrylic compound, a liquid acrylate, and the like can be appropriately selected depending on the purpose. Examples thereof may include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, urethane acrylate, and epoxy acrylate. In addition, it is also possible to use those in which acrylate is converted to methacrylate. These may be used singly or two or more kinds thereof may be used concurrently.

The latent curing agent is not particularly limited, and examples thereof may include various kinds of curing agents of a heat curing type, a UV curing type, and the like. The latent curing agent does not react under a normal condition, but it is activated by various kinds of triggers which are selected depending on the application, such as heat, light, and pressurization and starts to react. As the method for activating a thermally activated latent curing agent, there are a method in which active species (a cation or an anion, and a radical) are produced through the dissociation reaction caused by heating, and the like, a method in which the latent curing agent is stably dispersed in an epoxy resin at around room temperature, but at a higher temperature, it is compatible with and dissolves in the epoxy resin to start the curing reaction, a method in which a molecular sieve encapsulation type curing agent is eluted at a high temperature to start the curing reaction, a method of elution and curing by a microcapsule, and the like. Examples of the thermally activated latent curing agent may include imidazole-based one, hydrazide-based one, a boron trifluoride-amine complex, a sulfonium salt, an amine imide, a polyamine salt, dicyandiamide, and any modified product thereof, and these may be a single substance or a mixture of two or more kinds thereof. Among them, the microcapsule type imidazole-based latent curing agent is preferable.

The silane coupling agent is not particularly limited, and examples thereof may include epoxy-based one, amino-based one, mercapto and sulfide-based one, and ureido-based one. The adhesive property at the interface between an organic material and an inorganic material is improved by adding a silane coupling agent.

[Electrically Conductive Particles]

Examples of the electrically conductive particles 3 may include any known electrically conductive particles which are used in the anisotropic conductive film 1. Examples of the electrically conductive particles 3 may include particles of various kinds of metals such as nickel, iron, copper, aluminum, tin, lead, chromium, cobalt, silver, and gold, or particles of a metal alloy, a metal oxide, those obtained by coating a metal on the surface of particles of carbon, graphite, glass, a ceramic, a plastic, or the like, or those obtained by further coating an insulating film on the surface of these particles. In the case of those obtained by coating a metal on the surface of resin particles, examples of the resin particles may include particles of an epoxy resin, a phenolic resin, an acrylic resin, an acrylonitrile-styrene (AS) resin, a benzoguanamine resin, a divinylbenzene-based resin, and a styrene-based resin.

In the anisotropic conductive film 1, as to be described later, the electrically conductive particles 3 are regularly arranged in a predetermined array pattern and thus the occurrence of coarseness and fineness due to aggregation of the electrically conductive particles is prevented. Hence, according to the anisotropic conductive film 1, it is possible to prevent a short circuit between terminals by aggregates of the electrically conductive particles even though the narrowing of the interval between connecting terminals advances, it is also possible to capture the electrically conductive particles even in a microminiaturized connecting terminal and thus to meet the requirement of high density mounting.

Incidentally, the shape of the anisotropic conductive film 1 is not particularly limited, and for example, it may have a long tape shape capable of being wound around a take-up reel 6 as illustrated in FIG. 1 so that it may be cut by a predetermined length for use.

In addition, in the embodiment described above, the anisotropic conductive film 1 has been described by taking an adhesive film obtained by molding a thermosetting resin composition containing the electrically conductive particles 3 in the binder resin 2 in a film shape as an example, but the adhesive according to the invention is not limited thereto, and for example, it may have a configuration in which an insulating adhesive layer composed of only the binder resin 2 and an electrically conductive particle-containing layer composed of the binder resin 2 containing the electrically conductive particles 3 are laminated.

[Method for Manufacturing Anisotropic Conductive Film]

Next, the method for manufacturing the anisotropic conductive film 1 will be described. The anisotropic conductive film 1 is manufactured by aligning the electrically conductive particles 3 on a wiring board in a predetermined array pattern and then transferring the electrically conductive particles 3 to a film provided with a binder resin layer.

Figure 2:
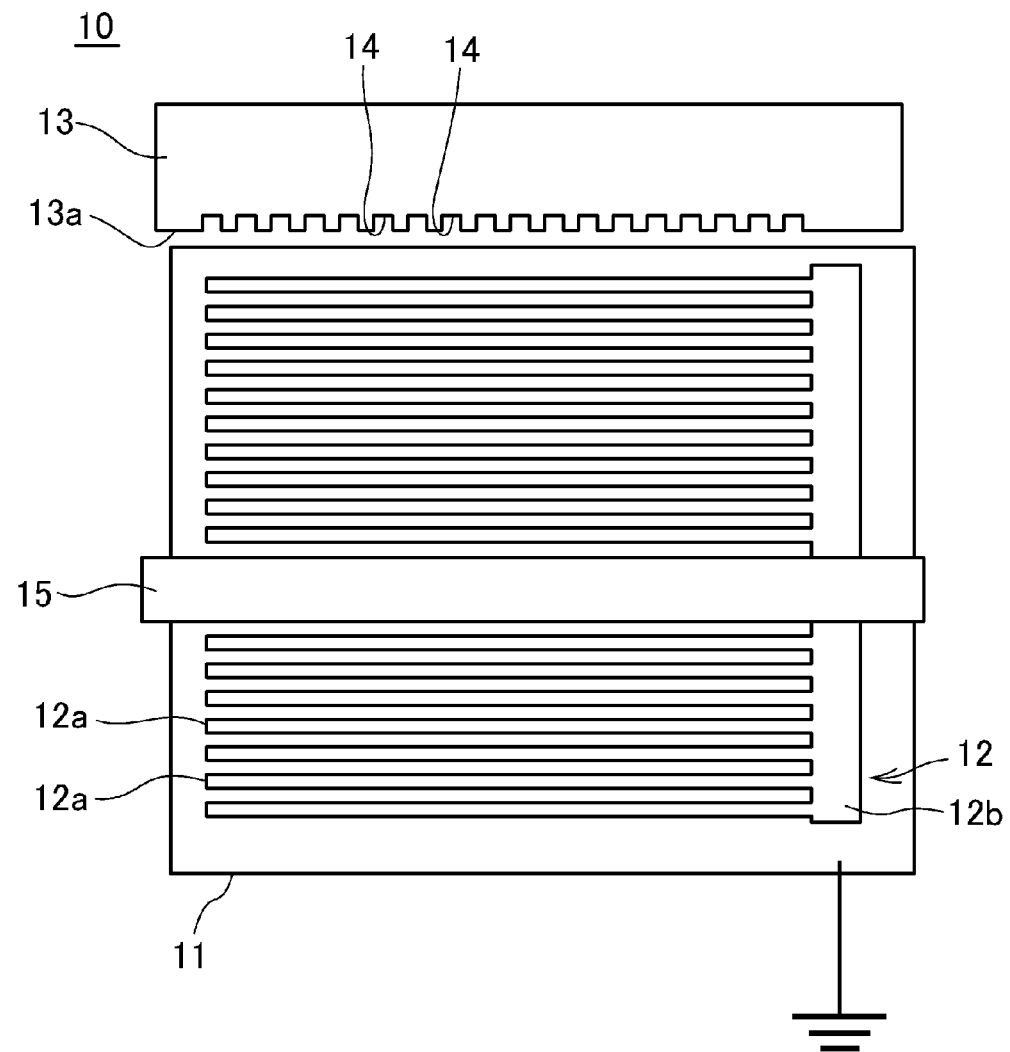
FIG. 2 is a view illustrating a wiring board on which electrically conductive particles are aligned and a squeegee.

In a wiring board 10 on which the electrically conductive particles 3 are aligned, as illustrated in FIG. 2, a wiring pattern 12 is formed on an insulating substrate 11 in accordance with the array pattern of the electrically conductive particles 3. As the insulating substrate 11, it is possible to use various kinds of known insulating substrates such as a glass epoxy substrate. The wiring pattern 12 is formed, for example, by a Cu wire, and it can be formed by a known technique such as etching or printing. In addition, the magnetic attraction of the electrically conductive particles 3 is prevented as the wiring pattern 12 is grounded and prevented from being charged.

In addition, the wiring pattern 12 is formed as a pattern corresponding to the array pattern of the electrically conductive particles 3 to be transferred to a binder resin 3 of the anisotropic conductive film 1, and in the wiring board 10, the electrically conductive particles 3 are charged and attached between the wiring patterns 12 by a squeegee 13 to be described later. Hence, the shape of the wiring pattern 12 is defined in accordance with the array pattern of the electrically conductive particles 3, and as illustrated in FIG. 2, the electrically conductive particles 3 are equally dispersed and disposed in accordance with the intervals of the respective linear patterns 12a as a plurality of linear patterns 12a are arranged in parallel. Incidentally, the respective linear patterns 12a are coupled to a ground wire 12b formed along one side edge of the insulating substrate 11 so as to be grounded via this ground wire 12b.

The squeegee 13 moves on the wiring board 10 to charge and attach the electrically conductive particles 3 between the wiring patterns 12 and to align them in accordance with the wiring patterns 12. In the squeegee 13, a plurality of recesses 14 are formed on a sliding side 13a which slides on the wiring board 10 at predetermined intervals. The respective recesses 14 allow the electrically conductive particles 3 to pass through and align the electrically conductive particles 3 at predetermined intervals defined by the intervals between adjacent recesses in association with the movement of the squeegee 13.

The electrically conductive particles 3 are equally dispersed and disposed at intervals of the linear patterns 12a with respect to the moving direction of the squeegee 13 and also at intervals of the recesses 14 with respect to the direction perpendicular to the moving direction of the squeegee 13 as the squeegee 13 having the plurality of recesses 14 formed at predetermined intervals is used as well as the plurality of linear patterns 12a are formed on the wiring board 10 in parallel at predetermined intervals.

Figure 3:
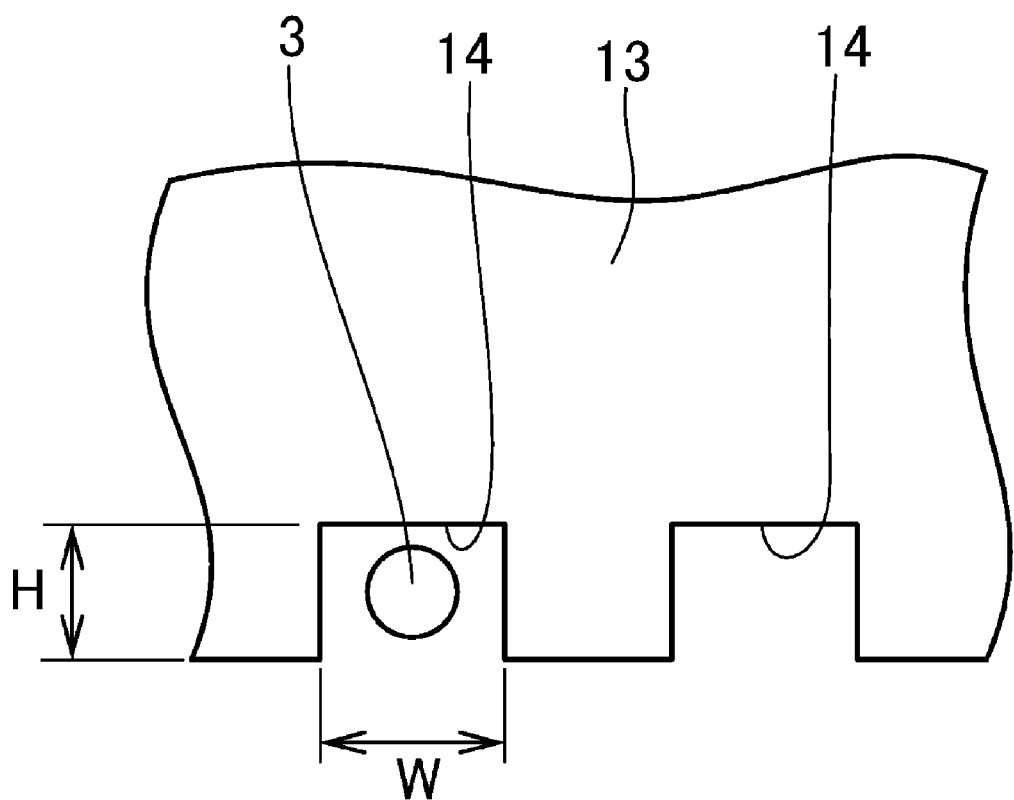
FIG. 3 is a front view illustrating recesses of the squeegee.

As illustrated in FIG. 3, the respective recesses 14 are formed so as to have a width W and a height H which are greater than the average particle size of the electrically conductive particles 3, and this makes it possible for the electrically conductive particles 3 to pass through the recesses 14. In addition, it is preferable that the recesses 14 are formed so as to have a width smaller than two times the average particle size of the electrically conductive particles 3. This is because the electrically conductive particles 3 are dispersed even after they have passed through the recesses 14 when the recesses 14 have a width to be equal to or greater than two times the average particle size of the electrically conductive particles 3 and thus it is concerned that the particle capture rate decreases.

Incidentally, the magnetic attraction of the electrically conductive particles 3 is prevented as the squeegee 13 is prevented from being charged. For example, the squeegee 13 is prevented from being charged as it is grounded as well as formed of an electrically conductive material such as Ni. In addition, the squeegee 13 may be prevented from being charged as it is formed of a material that is hardly charged. Moreover, such a squeegee 13 can be formed using an electroforming method and another known fine processing technology.

Figure 4:
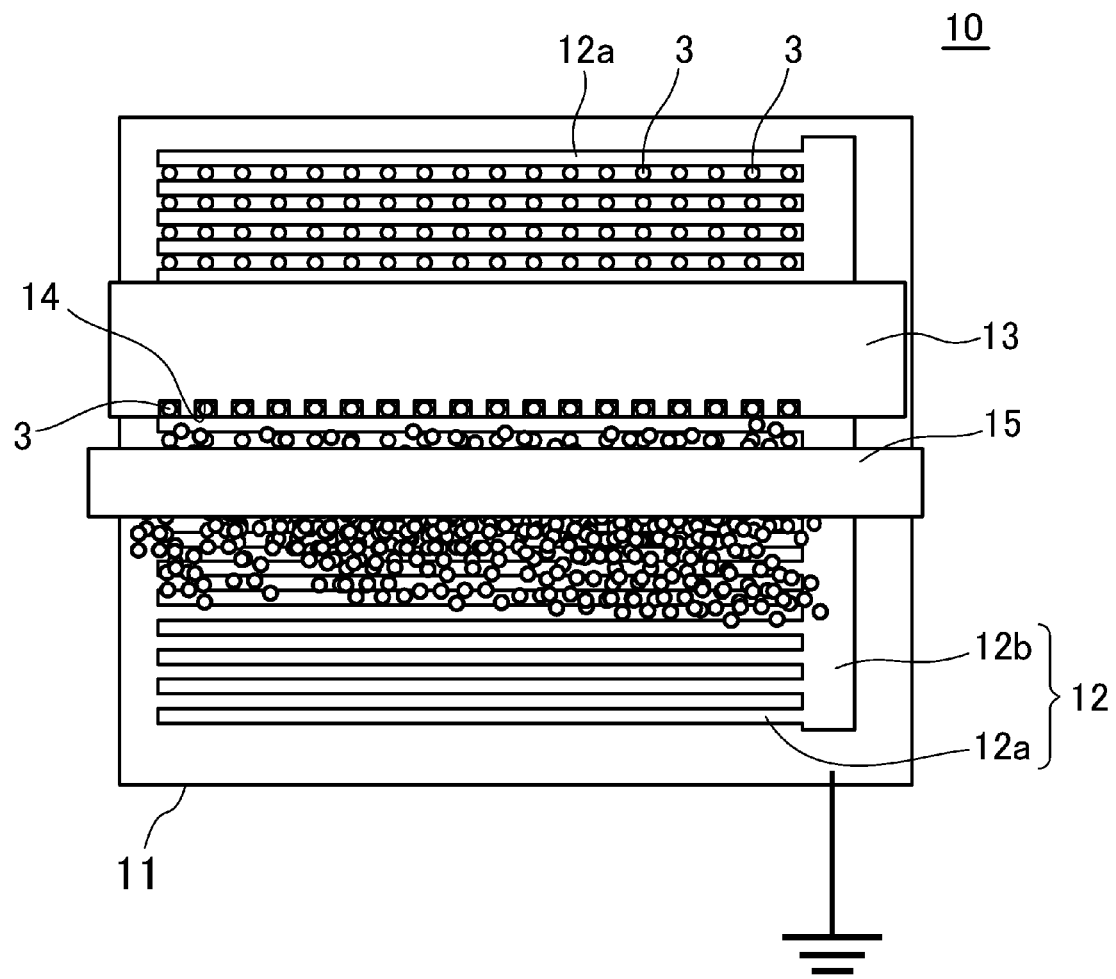
FIG. 4 is a view illustrating a state in which electrically conductive particles after being charged are aligned between wiring patterns by a squeegee.
Figure 5:
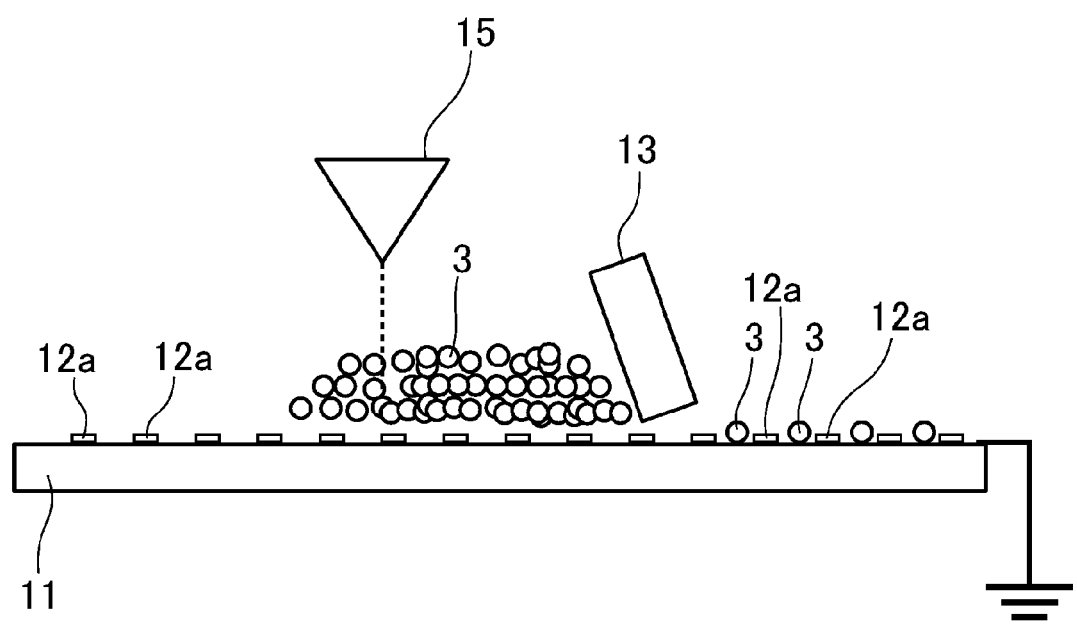
FIG. 5 is a view illustrating a state in which electrically conductive particles after being charged are aligned between the wiring patterns by a squeegee.

In order to align the electrically conductive particles 3 on the wiring board 10, first, the electrically conductive particles 3 are placed at one end of the wiring board 10 on which the wiring pattern 12 is formed. Subsequently, the electrically conductive particles 3 are charged with an electrical charge (for example, a negative charge) by moving a static electricity generator 15 from one end side to the other end side of the wiring board 10 (FIGS. 4 and 5).

After the static electricity generator 15, the squeegee 13 is slid from one end side to the other end side of the wiring board 10. By virtue of this, the electrically conductive particles 3 charged with an electrical charge are charged and attached between the linear patterns 12a while passing through the recesses 14 of the squeegee 13. At this time, the electrically conductive particles 3 are disposed at intervals of the linear patterns 12a with respect to the moving direction of the squeegee 13 and also at intervals of the recesses 14 with respect to the direction perpendicular to the moving direction of the squeegee 13.

Figure 6A:
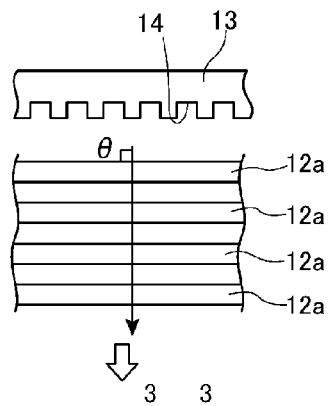
FIGS. 6(A) to 6(F) are views illustrating a manufacturing process of an anisotropic conductive film.
Figure 6B:
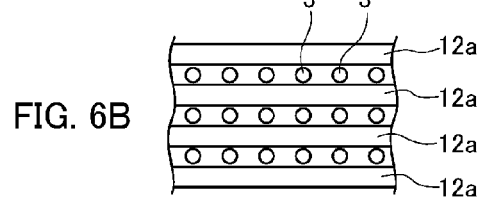

Thereafter, the electrically conductive particles 3 are equally dispersed and disposed on the wiring board 10 in a lattice shape at predetermined intervals defined by the linear pattern 12a and the recess 14 (FIG. 6(B)) as the moving direction of the squeegee 13 has an inclination θ of 90° with respect to the longitudinal direction of the linear pattern 12a as illustrated in FIG. 6(A).

Incidentally, the wiring pattern 12 and the squeegee 13 are prevented from being charged as they are grounded or the like, and thus the electrically conductive particles 3 that are charged with an electrical charge are not attached thereto but are securely dispersed and disposed between the linear patterns 12a at predetermined intervals.

The electrically conductive particles 3 that are dispersed and disposed on the wiring board 10 are transferred to a transfer film. A transfer film 20 is one that is obtained by coating the binder resin 2 described above on one surface of the first base film 4 constituting the anisotropic conductive film 1 and molding the resultant in a film shape. It is possible to transfer the electrically conductive particles 3 arranged in a predetermined pattern to the binder resin 2 in the pattern by bonding the surface coated with the binder resin 2 of the transfer film 20 on the wiring board 10.

Figure 6C:
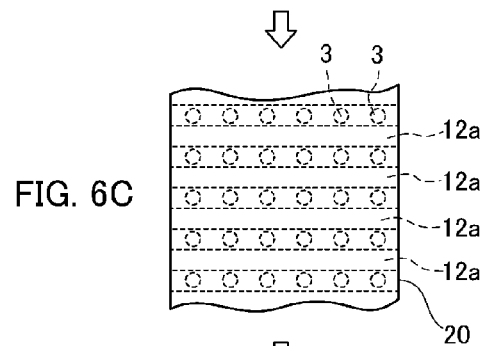
Figure 6E:
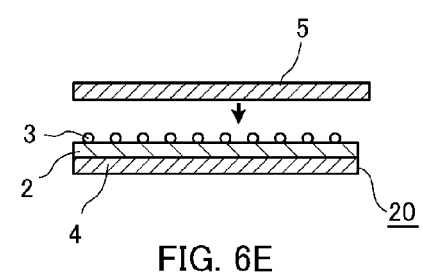
Figure 6D:
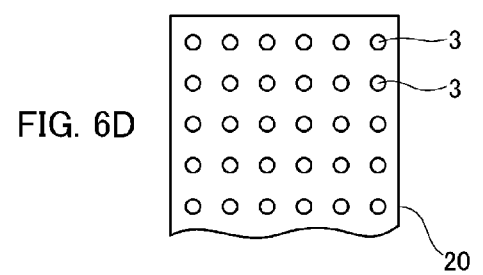

At this time, the electrically conductive particles 3 are arranged at 90° with respect to the longitudinal direction and the electrically conductive particles 3 are equally transferred in a lattice shape (FIG. 6(D)) by setting the longitudinal direction of the transfer film 20 to be parallel to the moving direction of the squeegee as illustrated in FIG. 6(C).

The second base film 5 constituting the anisotropic conductive film 1 is laminated on the transfer film 20 on which the electrically conductive particles 3 are transferred (FIG. 6(E)). The second base film 5 pushes the electrically conductive particles 3 transferred to the transfer film 20 into the binder resin 2 so as to achieve the positioning of the electrically conductive particles 3. The electrically conductive particles 3 are held in the binder resin 2 that is coated on the first and second base films 4 and 5 as the release treated surface of the second base film 5 is bonded to the surface on which the electrically conductive particles 3 are transferred of the transfer film 20. By virtue of this, the anisotropic conductive film 1 is formed in which the binder resin 2 containing the electrically conductive particles 3 is supported by the first and second base films 4 and 5 of an upper and lower pair.

Figure 6F:
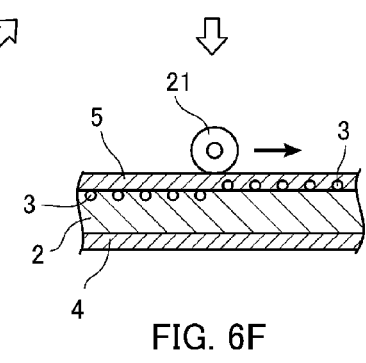

As illustrated in FIG. 6(F), the electrically conductive particles 3 are pushed into the side of the binder resin 2 coated on the second base film 5 as the anisotropic conductive film 1 is appropriately pressed by a laminating roll 21. Subsequently, the surface on which the electrically conductive particles 3 are pushed of the binder resin 2 is cured by being irradiated with ultraviolet rays from the first base film 4 side, and the like, and thus the anisotropic conductive film 1 is fixed in the pattern formed by transfer of the electrically conductive particles 3.

[Manufacturing Process of Connector]

The anisotropic conductive film 1 can be suitably used in a connector in which an IC or a flexible substrate is COG, FOB, or FOF connected and any devices such as television, or PC, mobile phones, game machines, audio devices, and tablet terminators, or vehicle-mounted monitors.

Figure 7:
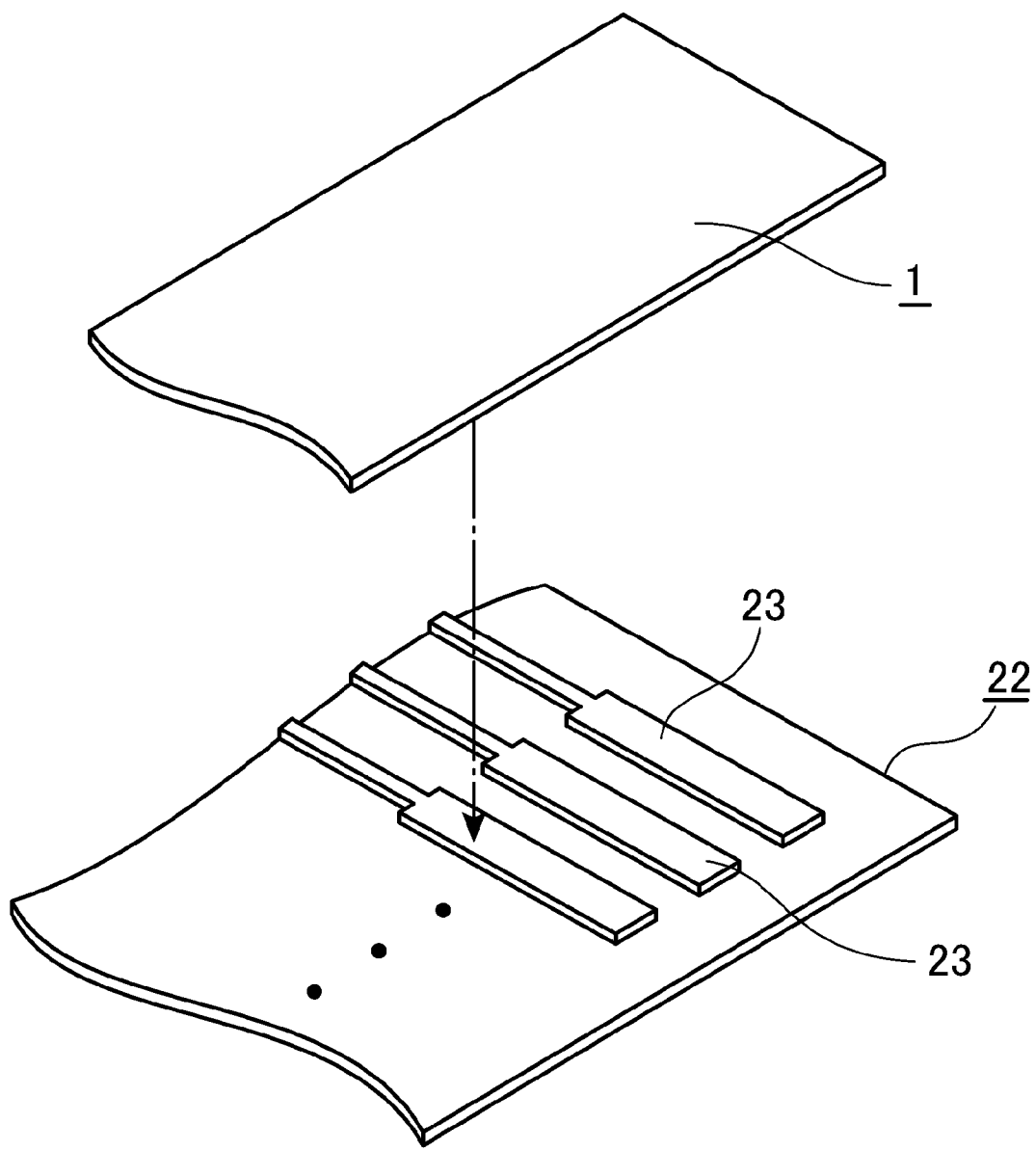
FIG. 7 is a perspective view illustrating a state in which an anisotropic conductive film is pasted to a rigid substrate having a plurality of connecting terminals arranged in parallel.

As illustrated in FIG. 7, a rigid substrate 22 that is connected to an IC or a flexible substrate via the anisotropic conductive film 1 is formed of a plurality of connecting terminals 23 arranged in parallel. These connecting terminals 23 are microminiaturized to meet the requirement of high density mounting and the interval between the connecting terminals is narrowed.

At the time of actual use, the anisotropic conductive film 1 is cut such that the size in the width direction corresponds to the size of the connecting terminal 23, the first base film 4 is then peeled off therefrom, and the anisotropic conductive film 1 thus cut is pasted on the plurality of connecting terminals 23 by taking the parallel direction of the connecting terminals 23 as the longitudinal direction. Subsequently, the connecting terminal of the IC or flexible substrate side is mounted on the connecting terminal 23 via the anisotropic conductive film 1, and the resultant is heated and pressurized by a pressure tool (not illustrated) from the top of it.

By virtue of this, the binder resin 2 is softened, the electrically conductive particles 3 are pressed and deformed between the connecting terminals facing each other, and the anisotropic conductive film 1 is cured in a state in which the electrically conductive particles 3 are pressed and deformed by being heated or irradiated with ultraviolet rays. By virtue of this, the anisotropic conductive film 1 electrically and mechanically connects an IC or a flexible substrate to a connecting target such as a glass substrate.

Here, the electrically conductive particles 3 are equally transferred in a lattice shape throughout the longitudinal direction in the anisotropic conductive film 1. Hence, it is possible to improve the conduction properties as the anisotropic conductive film 1 is securely captured on the microminiaturized connecting terminals 23, and it is possible to prevent a short circuit between adjacent terminals as the electrically conductive particles 3 are not linked to one another between the connecting terminals having a narrowed interval.

Second Embodiment

Subsequently, the second embodiment of the anisotropic conductive film to which the invention is applied will be described. Incidentally, the same configurations as the anisotropic conductive film 1 and the wiring board 10 described above will be denoted by the same reference numerals and will not be described in detail in the following description.

Figure 8:
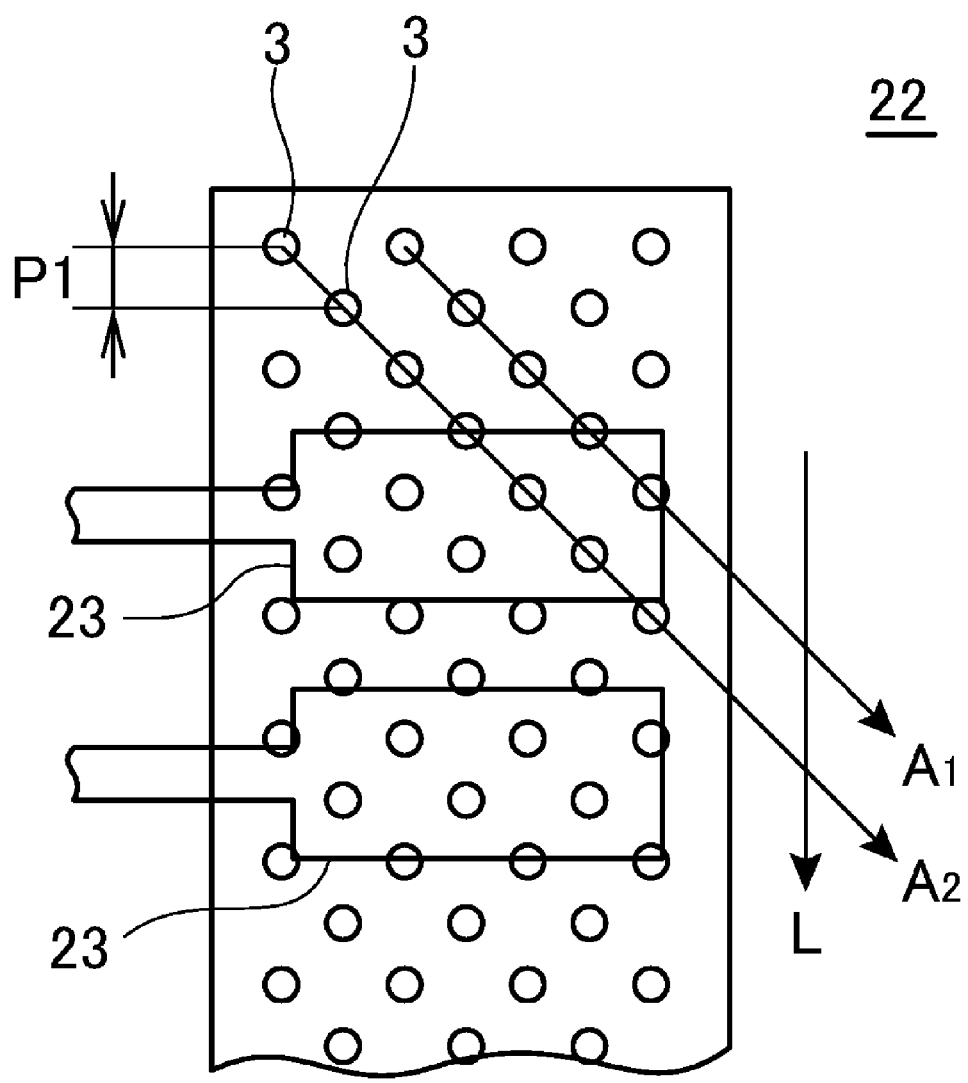
FIG. 8 is a view for describing a state in which another anisotropic conductive film is pasted to connecting terminals.

An anisotropic conductive film 30 illustrated in FIG. 8 is formed such that the array of the electrically conductive particles 3 is inclined with respect to the longitudinal direction. In the anisotropic conductive film 30, it is possible to narrow the pitch P1 of the electrically conductive particles 3 in the longitudinal direction as compared with the anisotropic conductive film 1 as the array of the electrically conductive particles 3 is inclined with respect to the longitudinal direction. Hence, when the anisotropic conductive film 30 is pasted by taking the parallel direction of the connecting terminal 23 as the longitudinal direction, the array pitch in the width direction of the microminiaturized connecting terminal 23 is narrowed, and thus it is possible to increase the particle capture rate on the connecting terminal 23.

Figure 9A:
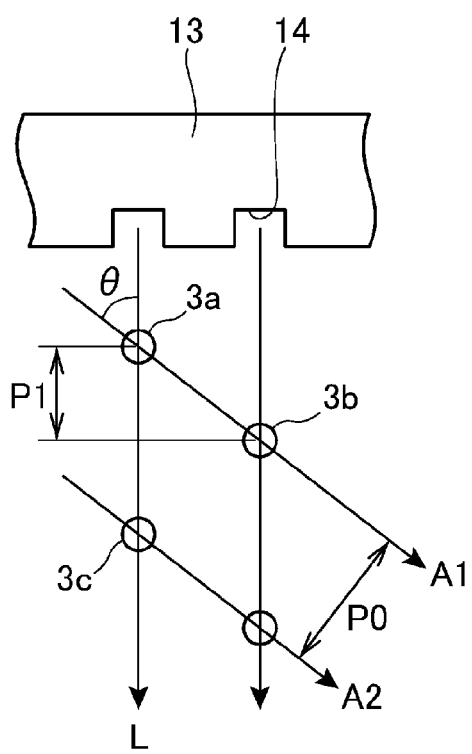
FIGS. 9(A) and 9(B) are views illustrating a state in which the array of electrically conductive particles is inclined with respect to the longitudinal direction (the moving direction of the squeegee) of the anisotropic conductive film, and illustrating the pitch between particles when the inclination is 90°, respectively.

In this anisotropic conductive film 30, as the linear pattern 12a formed on the wiring board 10 is inclined by a predetermined angle θ with respect to the moving direction of the squeegee 13, the arrays A1 and A2 of the electrically conductive particles 3 which are aligned along between the linear patterns 12a also have an inclination θ with respect to the longitudinal direction L (the moving direction of the squeegee 13) of the anisotropic conductive film 30 in the same manner as illustrated in FIG. 9(A).

Figure 9B:
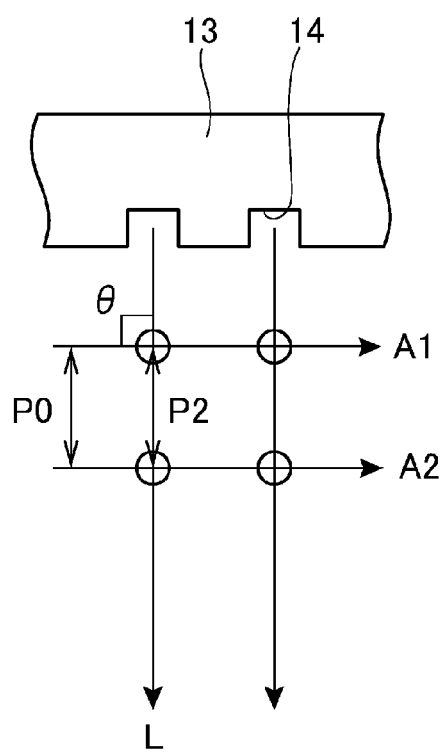

The particle arrays A1 and A2 in the anisotropic conductive film 1 in which the linear pattern 12a is at 90° with respect to the moving direction of the squeegee are illustrated in FIG. 9(B). In the anisotropic conductive film 1, the pitch P2 of the electrically conductive particles 3 in the longitudinal direction L corresponds to the interval of the linear patterns 12a. In other words, in the anisotropic conductive film 1, the pitch P2 of the electrically conductive particles 3 in the longitudinal direction is defined by the interval P0 between the particle arrays A1 and A2.

Meanwhile, in the anisotropic conductive film 30, the pitch P1 of the conductive particles 3 in the longitudinal direction L is defined by the distance between the electrically conductive particles 3a and 3b on the particle array A1 and between the electrically conductive particle 3b and the electrically conductive particle 3c on the particle array A2. Hence, in a case in which the interval P0 between the particle arrays A1 and A2 is the same as that in the anisotropic conductive film 1, it is possible to narrow the pitch P1 of the electrically conductive particles 3 in the longitudinal direction L in the anisotropic conductive film 30 as compared with the anisotropic conductive film 1.

[Manufacturing Process of Anisotropic Conductive Film 30]

Figure 10A:
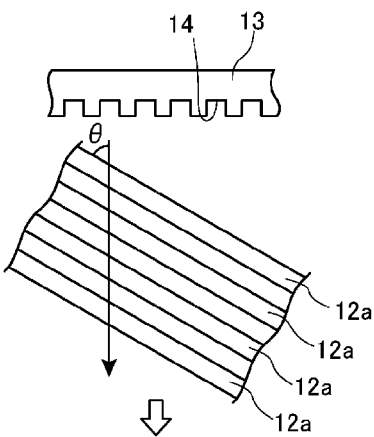
FIGS. 10(A) to 10(F) are views illustrating a manufacturing process of another anisotropic conductive film.

Subsequently, the manufacturing process of the anisotropic conductive film 30 will be described. As illustrated in FIG. 10(A), the wiring pattern 12 consisting of a plurality of linear patterns 12a is formed on the wiring board 10. At this time, the linear pattern 12a has an inclination θ, for example, of 30° or more and less than 90° with respect to the moving direction of the squeegee 13.

Figure 10B:
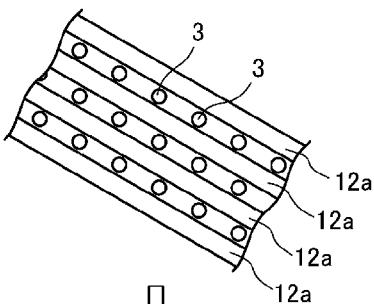

By virtue of this, the electrically conductive particles 3 are equally dispersed and disposed on the wiring board 10 at an angle along the linear pattern 12a and a predetermined interval defined by the interval of the recesses 14 (FIG. 10(B)).

The electrically conductive particles 3 that are dispersed and disposed on the wiring board 10 are transferred to the transfer film 20. It is possible to transfer the electrically conductive particles 3 arranged in a predetermined pattern to the binder resin 2 in the pattern by bonding the surface coated with the binder resin 2 of the transfer film 20 on the wiring board 10.

Figure 10C:
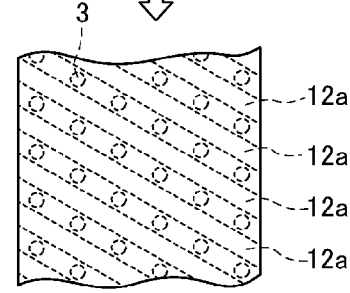
Figure 10D:
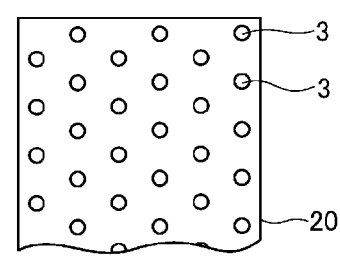
Figure 10E:
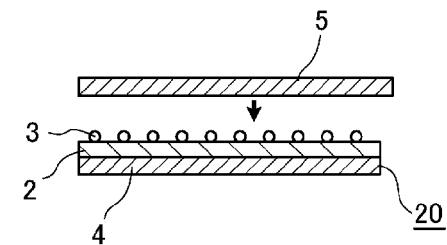
Figure 10F:
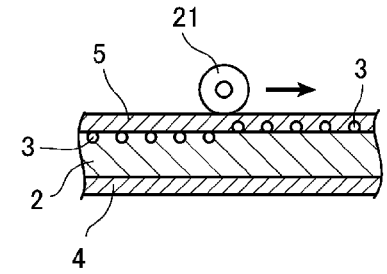

At this time, the electrically conductive particles 3 are arranged at a predetermined angle corresponding to the inclination of the linear pattern 12a with respect to the longitudinal direction (FIG. 10(D)) by setting the longitudinal direction of the transfer film 20 to be parallel to the moving direction of the squeegee as illustrated in FIG. 10(C). Thereafter, the anisotropic conductive film 30 is obtained as the second base film 5 is bonded to the transfer film 20 in the same manner as in the anisotropic conductive film 1 (FIGS. 10(E) and 10(F)).

At the time of actual use, the first base film 4 is peeled off from the anisotropic conductive film 30 and the anisotropic conductive film 30 is pasted on a plurality of connecting terminals 23 by taking the parallel direction of the connecting terminals 23 as the longitudinal direction (FIG. 7 and FIG. 8). Subsequently, the connecting terminal of the IC or flexible substrate side is mounted on the connecting terminal 23 via the anisotropic conductive film 30, and the resultant is heated and pressurized by a pressure tool (not illustrated) from the top of it, whereby an IC or a flexible substrate is electrically and mechanically connected to a connecting target such as a glass substrate.

Here, in the anisotropic conductive film 30, the electrically conductive particles 3 are arranged at a predetermined angle corresponding to the inclination of the linear pattern 12a with respect to the longitudinal direction. Hence, it is possible to narrow the pitch P of the electrically conductive particles 3 in the longitudinal direction in the anisotropic conductive film 30 as compared with the anisotropic conductive film 1. Moreover, when the anisotropic conductive film 30 is pasted by taking the arrangement direction of the connecting terminal 23 as the longitudinal direction, the array pitch of the electrically conductive particles 3 is narrowed with respect to the width direction of the microminiaturized connecting terminal 23, and thus it is possible to increase the particle capture rate on the connecting terminal 23.

[Angle of Electrically Conductive Particle Array]

Incidentally, in the anisotropic conductive film 30, it is preferable that the array angle of the electrically conductive particles 3 with respect to the longitudinal direction is 30° or more and less than 90°. This is because the interval in the arrangement direction of the electrically conductive particles 3 increases when the array angle is less than 30°, and it is concerned that a decrease in particle capture rate is rather caused.

[Roll-Shaped Substrate]

Figure 11A:
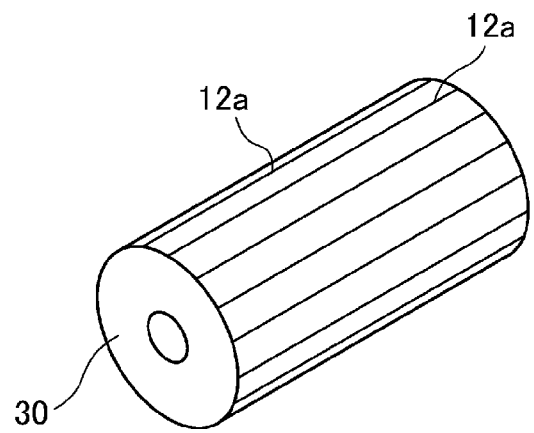
Figure 11B:
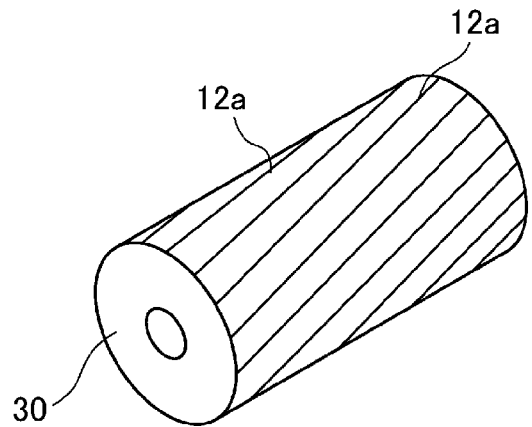
Figure 11C:
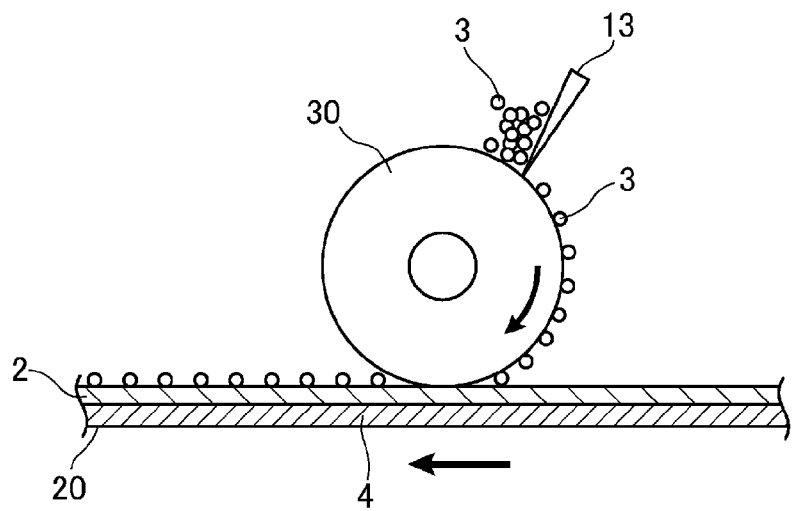
Figure 12A:
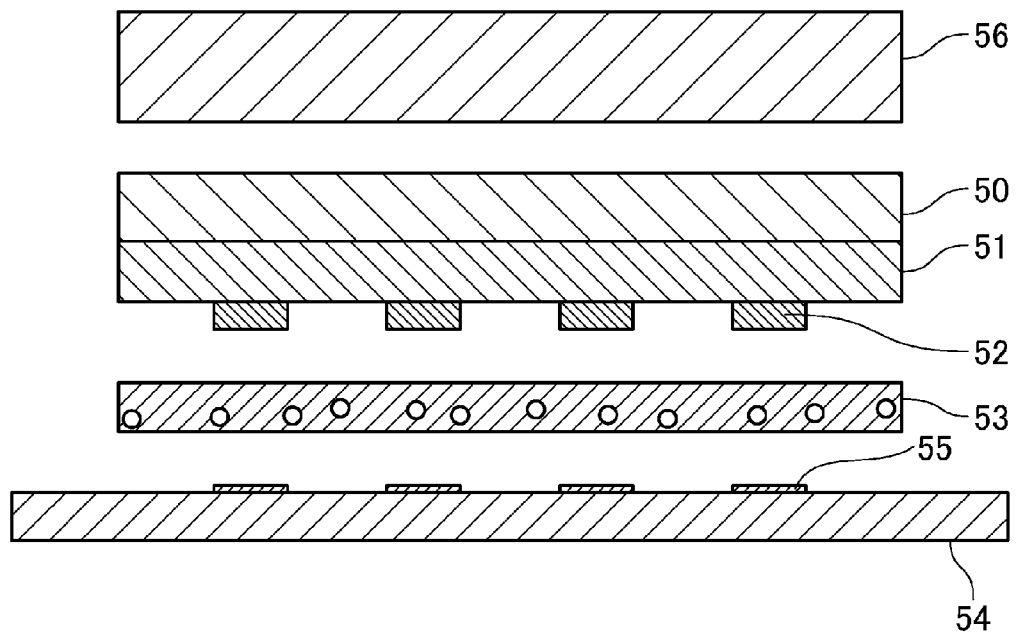
Figure 12B:
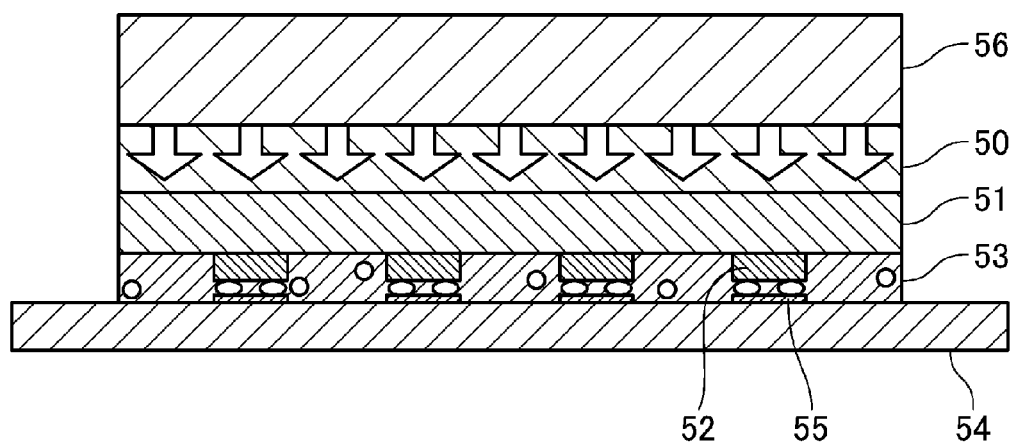

In addition, the wiring board may be formed in a roll shape as illustrated in FIGS. 11(A) to 11(C) in addition to a plate shape. The wiring pattern 12 is formed on the surface of the roll-shaped substrate 30 and also the roll-shaped substrate 30 rolls on the surface coated with the binder resin 2 of the transfer film 20. Moreover, as illustrated in FIG. 11(C), the electrically conductive particles 3 are supplied on the rolling direction upstream side of the roll-shaped substrate 30 and also charged with an electrical charge, thereafter, the electrically conductive particles 3 are aligned in a predetermined pattern corresponding to the wiring pattern 12 and charged and attached prior to the contact with the transfer film 20 as the squeegee 13 is slid.

By the use of the roll-shaped substrate 30, it is possible to repeatedly and continuously conduct a series of steps of the supply and charging of the electrically conductive particles 3, the alignment of the electrically conductive particles 3 by the squeegee 13, and the transfer of the electrically conductive particles 3 to the transfer film 20, and thus it is possible to improve the manufacturing efficiency.

Incidentally, it is possible to form the anisotropic conductive film 1 to which the electrically conductive particles 3 are equally transferred in a lattice shape with respect to the longitudinal direction (FIG. 11(A)) by setting the angle of the linear pattern 12a of the wiring pattern 12 formed on the roll surface to 90° with respect to the rolling direction of the roll in the roll-shaped substrate 30 as well. In addition, it is possible to form the anisotropic conductive film 30 in which the pitch P of the electrically conductive particles 3 in the longitudinal direction is narrowed as compared with the anisotropic conductive film 1 (FIG. 11(B)) by setting the linear pattern 12a to have a predetermined inclination (for example, 30° or more and less than 90°) with respect to the rolling direction of the roll in the roll-shaped substrate 30.

[Content of Aggregate]

Incidentally, as described above, according to the invention, the electrically conductive particles 3 charged with an electrical charge are charged and attached between the linear patterns 12a while passing through the recesses 14 of the squeegee 13 as the squeegee 13 is slid from one end side to the other end side of the wiring board 10. At this time, the electrically conductive particles 3 are equally dispersed and disposed at intervals of the linear patterns 12a with respect to the moving direction of the squeegee 13 and also at intervals of the recesses 14 with respect to the direction perpendicular to the moving direction of the squeegee 13.

At this time, aggregates in which a plurality of electrically conductive particles 3 are linked to one another are within 20%, preferably within 10%, more preferably 5% of the total number of electrically conductive particles. The size of the aggregate is set to be preferably 8 times or less and more preferably 5 times or less the average particle size of the electrically conductive particles at most. The size of the aggregate mentioned here also includes the maximum length of the aggregate in which the electrically conductive particles 3 are linked to one another.

[Mark of Sliding Contact with Squeegee]

In addition, the mark of sliding contact with the squeegee 13 is generated on the electrically conductive particles 3 since the electrically conductive particles 3 are charged and attached between the linear patterns 12a while passing through the recesses 14 of the squeegee 13. For example, a part of the surface is peeled off or turned inside out in the case of using plated particles as the electrically conductive particles 3. In addition, a part of the electrically conductive particles 3 is deformed in some cases in the case of using metal particles as the electrically conductive particles 3. The flow of the electrically conductive particles 3 is suppressed at the time of transfer to the binder resin 2 or at the time of heat pressurization of the anisotropic conductive film 1 as such a mark of sliding contact is generated in 5% or more of the surface area of the electrically conductive particles 3. In addition, the conduction performance is not affected when the mark of sliding contact is generated within 30% of the total electrically conductive particles 3, but it is preferable that the mark of sliding contact is generated within 15% of the total number of the electrically conductive particles.

EXAMPLES

Subsequently, Examples of the invention will be described. In the present Examples, a plurality of the anisotropic conductive films which were manufactured by different manufacturing methods were prepared, and connector samples were manufactured in which an IC was connected onto a glass substrate using each of the anisotropic conductive films. Thereafter, the conduction resistance ($\Omega$) and the proportion (ppm) of short circuit between terminals were determined for each of the connector samples.

In the anisotropic conductive films according to Examples and Comparative Examples, a resin composition prepared by blending:

60 parts by mass of a phenoxy resin (YP-50, manufactured by NIPPON STEEL & SUMIKIN CHEMICAL CO., LTD.);

40 parts by mass of an epoxy resin (jER828, manufactured by Mitsubishi Chemical Corporation); and 2 parts by mass of a cationic curing agent (SI-60L, manufactured by SANSHIN CHEMICAL INDUSTRY CO., LTD.) was used as a binder resin.

As the anisotropic conductive films according to Examples and Comparative Examples, a mixed solution was prepared by adjusting the solid content of these resin compositions to be 50% with toluene, the mixed solution was coated on a PET film having a thickness of 50 µm, and the coated PET film was dried in an oven at 80° C. for 5 minutes, thereby obtaining an anisotropic conductive film containing a binder resin 2 having a thickness of 20 µm.

In addition, in the anisotropic conductive films according to Examples and Comparative Examples, AUL704: (average particle size: 4 µm, manufactured by SEKISUI CHEMICAL CO., LTD.) was used as the electrically conductive particles.

A glass substrate (trade name: 1737F, manufactured by Corning Incorporated, size: 50 mm×30 mm, thickness: 0.5 mm) on which an aluminum wiring pattern corresponding to the pattern of the IC chip was formed was used as the glass substrate. The anisotropic conductive films according to Examples and Comparative Examples were disposed on this glass substrate, the IC chip (size: 1.5 mm×13.0 mm, thickness: 0.5 mm, gold bump size: 25 µm×140 µm, bump height: 15 µm, pitch: 7.5 µm) was disposed on the anisotropic conductive film, and the resultant was heated and pressurized, thereby connecting the IC chip and the aluminum wiring patterned glass substrate to each other. The condition for pressure joining was 180° C., 80 MPa, and 5 seconds.

Example 1

In Example 1, the electrically conductive particles were aligned on the wiring board in a predetermined array pattern and the electrically conductive particles were transferred to a film provided with a binder resin layer, thereby manufacturing the anisotropic conductive film. A plurality of linear patterns were formed on the wiring board according to Example 1 in parallel with a Cu wire and also the respective linear patterns were grounded so as to be prevented from being charged.

The recesses having a width of 6 µm and a height of 6 µm were formed at regular intervals on the squeegee which moves on the wiring board. In addition, the squeegee was formed by Ni and also was grounded so as to be prevented from being charged.

First, the electrically conductive particles are placed on the wiring board, and then the static electricity generator is moved from one end side to the other end side of the wiring board to charge the electrically conductive particles with a negative charge. After the static electricity generator is moved, the squeegee is slid from one end side to the other end side of the wiring board. At this time, in Example 1, the moving direction of the squeegee is set to be 90° with respect to the longitudinal direction of the linear patterns. By virtue of this, the electrically conductive particles are equally dispersed and disposed on the wiring board in a lattice shape at a predetermined interval defined by the linear patterns and the recesses (see FIG. 6(B)).

Subsequently, the electrically conductive particles that are dispersed and disposed on the wiring board are transferred to the PET film coated with the binder resin described above. At this time, the electrically conductive particles are equally transferred in a lattice shape throughout the longitudinal direction by setting the longitudinal direction of the PET film to be parallel to the moving direction of the squeegee (see FIGS. 6(C) and 6(D)).

Finally, a second PET film was laminated on the surface on which the electrically conductive particles 3 were transferred of the PET film on which the electrically conductive particles were transferred, thereby obtaining an anisotropic conductive film (see FIGS. 6(E) and 6(F)).

This anisotropic conductive film was pasted on a plurality of connecting terminals by taking the parallel direction of the connecting terminals of an aluminum wiring pattern formed on a glass substrate as the longitudinal direction (see FIG. 7).

Example 2

In Example 2, an anisotropic conductive film was obtained under the same conditions as in Example 1 except that the width of the recess of the squeegee was 5 µm.

Example 3

In Example 3, an anisotropic conductive film was obtained under the same conditions as in Example 1 except that the width of the recess of the squeegee was 7 µm.

Example 4

In Example 4, an anisotropic conductive film was obtained under the same conditions as in Example 1 except that the width of the recess of the squeegee was 9 µm.

Example 5

In Example 5, the moving direction of the squeegee was inclined by 30° with respect to the longitudinal direction of the linear patterns. By virtue of this, the electrically conductive particles are dispersed and disposed on the wiring board at an angle along the linear pattern and at a predetermined interval defined by the recesses (see FIG. 10(B)). In addition, the dimensions of the recess of the squeegee are the same as those in Example 1.

The electrically conductive particles that are dispersed and disposed on the wiring board are transferred to the PET film. At this time, the electrically conductive particles are arranged at a predetermined angle corresponding to the inclination of the linear pattern with respect to the longitudinal direction by setting the longitudinal direction of the PET film to be parallel to the moving direction of the squeegee (see FIGS. 10(C) and 10(D)). Thereafter, a second PET film was bonded on the PET film in the same manner as in Example 1, thereby obtaining an anisotropic conductive film.

Example 6

In Example 6, an anisotropic conductive film was obtained under the same conditions as in Example 5 except that the moving direction of the squeegee was inclined by 60° with respect to the longitudinal direction of the linear pattern.

Example 7

In Example 7, an anisotropic conductive film was obtained under the same conditions as in Example 5 except that the moving direction of the squeegee was inclined by 15° with respect to the longitudinal direction of the linear pattern.

Comparative Example 1

In Comparative Example 1, an anisotropic conductive film was obtained by a manufacturing method of prior art. In other words, an anisotropic conductive film molded in a film shape was obtained by coating a resin composition prepared by dispersing electrically conductive particles in the binder resin described above on a PET film and drying it. In the anisotropic conductive film according to Comparative Example 1, the electrically conductive particles are randomly disposed in the binder resin.

This anisotropic conductive film was pasted on a plurality of connecting terminals by taking the parallel direction of the connecting terminals of an aluminum wiring pattern formed on a glass substrate as the longitudinal direction.

Comparative Example 2

In Comparative Example 2, a pressure sensitive adhesive layer was formed by coating an acrylic polymer on a 100 μm of unstretched copolymerized polypropylene film and drying it. The electrically conductive particles were filled all over this pressure sensitive adhesive material layer, and the electrically conductive particles that did not reach the pressure sensitive adhesive were removed by air blowing, thereby forming a single-layer electrically conductive particle layer having a filling rate of 60%.

Next, this polypropylene film on which the electrically conductive particles were fixed was stretched to 2.0 times at 135° C. and at a ratio of 10%/sec in both vertical and horizontal directions using a biaxial stretching apparatus for test and was gradually cooled up to room temperature, thereby obtaining an array sheet.

Next, a PET film coated with a binder resin (transfer film) was superimposed on the electrically conductive particle side of this array sheet and laminated under the condition of 60° C. and 0.3 MPa to embed the electrically conductive particles into the binder resin, and the polypropylene film and the pressure sensitive adhesive were peeled off therefrom. Thereafter, a second PET film was bonded on the PET film in the same manner as in Example 1, thereby obtaining an anisotropic conductive film.

This anisotropic conductive film was pasted on a plurality of connecting terminals by taking the parallel direction of the connecting terminals of an aluminum wiring pattern formed on a glass substrate as the longitudinal direction.

Connector samples were manufactured in which an IC was connected onto a glass substrate using these anisotropic conductive films according to the respective Examples and Comparative Examples. Thereafter, the conduction resistance (Ω) and the proportion (ppm) of short circuit between terminals were determined for each of the respective connector samples. The results are presented in Table 1.

TABLE 1

| | Example 1 | Example 2 | Example 3 | Example 4 | Example 5 | Example 8 | Example 7 | Comparative Example 1 | Comparative Example 2 |
|---|---|---|---|---|---|---|---|---|---|
| Arrangement of electrically conductive particles | Equal disposition | Equal disposition | Equal disposition | Equal disposition | Equal disposition | Equal disposition | Equal disposition | Random disposition | Equal disposition |
| Angle of particle array with respect to longitudinal direction of film | 90° | 90° | 90° | 90° | 30° | 60° | 15° | — | — |
| Width of recess of squeegee(μm) | 6 | 5 | 7 | 9 | 6 | 6 | 6 | — | — |
| Conduction resistance | 0.2 | 0.3 | 0.2 | 2 | 0.1 | 0.1 | 0.8 | 0.2 | 0.2 |
| Proportion of short circuit between terminals(ppm) | 1 or less | 1 or less | 1 or less | 1 or less | 1 or less | 1 or less | 1 or less | 3000 | 300 |

As presented in Table 1, in all of Examples 1 to 7, the conduction resistance between the IC chip and the connecting terminal formed on the glass substrate was as low as 0.8Ω or less and the proportion of short circuit between the terminals was also 1 ppm or less.

On the other hand, in Comparative Example 1, although the conduction resistance was as low as 0.2Ω, the proportion of short circuit between the terminals was as frequent as 3000 ppm. In the same manner, in Comparative Example 2, although the conduction resistance was as low as 0.2Ω, the proportion of short circuit between the terminals was as frequent as 3000 ppm.

This is because, in Examples 1 to 7, the anisotropic conductive films formed by transferring the electrically conductive particles 3 that were equally disposed in the wiring board 10 were used, and thus it was possible to maintain a high particle capture rate even though the connecting terminal was microminiaturized and the interval between the connecting terminals was narrowed and also it was possible to prevent a short circuit between the narrowed terminals as the aggregation of the particles was prevented.

On the other hand, in Comparative Example 1, the electrically conductive particles were randomly dispersed in the binder resin, and thus the locations at which the electrically conductive particles were concentrated and the locations at which the electrically conductive particles were dispersed were generated in the binder resin, the electrically conductive particles were linked to one another between the adjacent terminals having a narrowed interval, and thus a short circuit between terminals occurred as frequently as 3000 ppm.

In addition, in Comparative Example 2, not all of the electrically conductive particles were separated from one another by the method to separate the electrically conductive particles from one another by biaxial stretching, the aggregate of particles in which a plurality of electrically conductive particles were linked to one another remained, and the short circuit between the adjacent terminals having a narrowed interval occurred as frequently as 300 ppm, and thus it was not possible to completely prevent the short circuit.

When Examples 1 to 7 are compared to one another, the conduction resistance was from 0.2 to 0.3 (Ω) in Examples 1 to 3 in which the width of the recess of the squeegee was less than two times the average particle size of the electrically conductive particles but the conduction resistance increased to 2.0 (Ω) in Example 4 in which the width was more than two times. This is because the particles were arranged to be dispersed as the width of the recess of the squeegee through which the electrically conductive particles passed was widened, and thus the particle capture rate slightly decreased. From this fact, it can be understood that it is preferable to set the width of the recess of the squeegee to be less than two times the average particle size of the electrically conductive particles.

In addition, among Examples 5 to 7 in which the moving direction of the squeegee was inclined by a predetermined angle with respect to the linear pattern, in Examples 5 and 6 in which the inclination was set to 30° and 60°, respectively, the conduction resistance was 0.1 (Ω) to be lower than that in Examples 1 to 4 in which the moving direction of the squeegee was inclined by 90° with respect to the linear pattern. This is because the array of electrically conductive particles was inclined by a predetermined degree with respect to the longitudinal direction of the anisotropic conductive film, thus the particle pitch in the width direction of the connecting terminals was narrowed when the anisotropic conductive film was pasted along the parallel direction of the connecting terminal, and a great number of particles were captured in the microminiaturized connecting terminal as well.

Incidentally, in Example 7, the particle pitch on the particle array of the anisotropic conductive film increased as the inclination was set to 15°, and thus the particle capture rate in the longitudinal direction of the connecting terminal decreased and the conduction resistance slightly increased to be 0.8 (Ω). From this fact, it can be understood that it is preferable to set the moving direction of the squeegee to be 30° or more with respect to the linear pattern.

REFERENCE SIGNS LIST

1 Anisotropic conductive film, 2 Binder resin, 3 Electrically conductive particles, 4 First base film, 5 Second base film, 6 Take-up reel, 10 Wiring board, 11 Insulating substrate, 12 Wiring pattern, 12a Linear pattern, 13 Squeegee, 14 Recess, 15 Static electricity generator, 20 Transfer film, 30 Roll-shaped substrate

The invention claimed is:

1. A method for manufacturing an electrically conductive adhesive film, the method comprising:
a step of scattering electrically conductive particles on a wiring board having wiring that is formed in accordance with an array pattern of the electrically conductive particles and prevented from being charged and charging the electrically conductive particles;
a step of aligning the charged electrically conductive particles in a predetermined array pattern corresponding to the wiring pattern by moving a squeegee on the wiring board; and
a step of bonding a transfer film having an adhesive layer formed thereon to the wiring board and transferring the electrically conductive particles aligned in a predetermined array pattern to the adhesive layer,
wherein a recess for allowing the electrically conductive particles to pass through is formed on the squeegee in accordance with the array pattern of the electrically conductive particles.

2. The method for manufacturing an electrically conductive adhesive film according to claim 1, wherein
a plurality of linear patterns are arranged in parallel to form the wiring, and
a moving direction of the squeegee is inclined by 90° with respect to a longitudinal direction of the linear pattern.

3. The method for manufacturing an electrically conductive adhesive film according to claim 1, wherein
a plurality of linear patterns are arranged in parallel to form the wiring,
a moving direction of the squeegee is inclined by 30° or more and less than 90° with respect to a longitudinal direction of the linear pattern, and
the transfer film is bonded to the wiring board by setting a longitudinal direction of the transfer film to the same direction as a moving direction of the squeegee.

4. A method for manufacturing an electrically conductive adhesive film, the method comprising:
a step of scattering electrically conductive particles on a wiring board having wiring that is formed in accordance with an array pattern of the electrically conductive particles and prevented from being charged and charging the electrically conductive particles;
a step of aligning the charged electrically conductive particles in a predetermined array pattern corresponding to the wiring pattern by moving a squeegee on the wiring board; and
a step of bonding a transfer film having an adhesive layer formed thereon to the wiring board and transferring the electrically conductive particles aligned in a predetermined array pattern to the adhesive layer,
wherein the squeegee is prevented from being charged.

5. The method for manufacturing an electrically conductive adhesive film according to claim 1, wherein a width of the recess on the squeegee is greater than an average particle size of the electrically conductive particles and smaller than two times the average particle size the electrically conductive particles.

6. A method for manufacturing an electrically conductive adhesive film, the method comprising:
a step of scattering electrically conductive particles on a wiring board having wiring that is formed in accordance with an array pattern of the electrically conductive particles and prevented from being charged and charging the electrically conductive particles;
a step of aligning the charged electrically conductive particles in a predetermined array pattern corresponding to the wiring pattern by moving a squeegee on the wiring board; and
a step of bonding a transfer film having an adhesive layer formed thereon to the wiring hoard and transferring the electrically conductive particles aligned in a predetermined array pattern to the adhesive layer,
wherein the wiring board is formed in a roll shape, and a series of steps of scattering and charging of the electrically conductive particles, aligning of the electrically conductive particles by the squeegee, and transferring of the electrically conductive particles to the transfer film is repeatedly and continuously conducted as the wiring board rotates.

7. The method for manufacturing an electrically conductive adhesive film according to claim 1, wherein the squeegee is formed by an electroforming method.

8. An electrically conductive adhesive film comprising:
a base film;
a binder resin that is laminated on the base film; and
electrically conductive particles that are regularly dispersed and disposed on the binder resin in a predetermined array pattern, wherein an aggregate of the plurality of electrically conductive particles is within 20% of a total particle number.

9. An electrically conductive adhesive film comprising:
a base film;
a binder resin that is laminated on the base film; and
electrically conductive particles that are regularly dispersed and disposed on the binder resin in a predetermined array pattern, wherein
electrically conductive particles having a mark of sliding contact on a surface at 5% or more of a surface area among the plurality of electrically conductive particles are within 30% of a total particle number.

10. An electrically conductive adhesive film comprising:
a base film;
a binder resin that is laminated on the base film; and
electrically conductive particles that are regularly dispersed and disposed on the binder resin in a predetermined array pattern, wherein
an aggregate of the plurality of electrically conductive particles is within 20% of a total particle number, wherein the electrically conductive adhesive film is manufactured by the manufacturing method according to claim 3.

11. A method for manufacturing a connector obtained by connecting a plurality of terminals arranged in parallel to one another by an anisotropic conductive film having conductive particles arranged therein, wherein
the anisotropic conductive film is manufactured by
a step of scattering electrically conductive particles on a wiring board having wiring that is formed in accordance with an array pattern of the electrically conductive particles and prevented from being charged and charging the electrically conductive particles;
a step of aligning the charged electrically conductive particles in a predetermined array pattern corresponding to the wiring pattern by moving a squeegee prevented from being charged on the wiring board; and
a step of bonding a transfer film having an adhesive layer formed thereon to the wiring board and transferring the electrically conductive particles aligned in a predetermined array pattern to the adhesive layer, and
the anisotropic conductive film is sandwiched between the terminals by setting a parallel direction of the terminals as a longitudinal direction.

12. The method for manufacturing a connector according to claim 11, wherein a longitudinal direction of the anisotropic conductive film is inclined by 30° or more and less than 90° with respect to an arrangement direction of the electrically conductive particles.

13. An electrically conductive adhesive film comprising:
a base film;
a binder resin that is laminated on the base film; and
electrically conductive particles that are regularly dispersed and disposed on the binder resin in a predetermined array pattern,
wherein electrically conductive particles having a mark of sliding contact on a surface at 5% or more of a surface area among the plurality of electrically conductive particles are within 30% of a total particle number,
wherein the electrically conductive adhesive film is manufactured by the manufacturing method according to claim 3.

* * * * *